(12) United States Patent
Tasher et al.

(10) Patent No.: US 9,343,162 B2
(45) Date of Patent: May 17, 2016

(54) PROTECTION AGAINST SIDE-CHANNEL ATTACKS ON NON-VOLATILE MEMORY

(71) Applicant: Winbond Electronics Corporation, Taichung (TW)

(72) Inventors: Nir Tasher, Tel Mond (IL); Valery Teper, Petah Tikva (IL); Dennis Chin Cheng, Palo Alto, CA (US); Boaz Tabachnik, Moshav Gimzo (IL)

(73) Assignee: WINBOND ELECTRONICS CORPORATION, Taichung (TW)

( * ) Notice: Subject to any disclaimer, the term of this patent is extended or adjusted under 35 U.S.C. 154(b) by 0 days.

(21) Appl. No.: 14/467,077

(22) Filed: Aug. 25, 2014

(65) Prior Publication Data

US 2015/0103598 A1    Apr. 16, 2015

Related U.S. Application Data

(60) Provisional application No. 61/889,539, filed on Oct. 11, 2013.

(51) Int. Cl.
| | |
|---|---|
| *G11C 16/04* | (2006.01) |
| *G11C 16/22* | (2006.01) |
| *G11C 16/10* | (2006.01) |
| *G11C 7/24* | (2006.01) |
| *G06F 12/14* | (2006.01) |

(52) U.S. Cl.
CPC ........ *G11C 16/22* (2013.01); *G11C 7/24* (2013.01); *G11C 16/10* (2013.01); *G06F 12/1433* (2013.01)

(58) Field of Classification Search
CPC .......... G11C 16/22; G11C 16/10; G11C 7/24; G06F 21/0012; G06F 12/1433
USPC .................... 365/185.04, 185.332, 189.04
See application file for complete search history.

(56) References Cited

U.S. PATENT DOCUMENTS

| | | | |
|---|---|---|---|
| 4,521,853 A | 6/1985 | Guttag | |
| 5,671,283 A | 9/1997 | Michener et al. | |
| 6,915,175 B2 * | 7/2005 | Ahn ...................... | G11C 16/10 326/37 |
| 6,976,136 B2 | 12/2005 | Falik et al. | |
| 7,194,626 B2 | 3/2007 | Craft | |
| 7,248,696 B2 | 7/2007 | Craft et al. | |
| 7,269,747 B2 | 9/2007 | Catherman et al. | |
| 7,739,565 B1 | 6/2010 | Lesea | |
| 7,826,271 B2 * | 11/2010 | Cernea ............... | G11C 16/3454 365/185.19 |

(Continued)

FOREIGN PATENT DOCUMENTS

| | | |
|---|---|---|
| AU | 2001027074 B2 | 7/2001 |
| EP | 1615370 A1 | 1/2006 |

(Continued)

OTHER PUBLICATIONS

TCG PC Specific Implementation Specification, Version 1.1, 72 pages, Aug. 18, 2003.

(Continued)

*Primary Examiner* — Pho M Luu

(74) *Attorney, Agent, or Firm* — D.Kligler IP Services Ltd.

(57) ABSTRACT

A non-volatile memory (NVM) device includes an NVM array, which is configured to store data, and control logic. The control logic is configured to receive data values for storage in the NVM array, and to write at least some of the received data values to the NVM array and simultaneously to write complements of the at least some of the received data values.

24 Claims, 4 Drawing Sheets

(56) References Cited

U.S. PATENT DOCUMENTS

| | | | |
|---|---|---|---|
| 7,836,269 B2 | 11/2010 | Obereiner et al. | |
| 7,881,094 B2 * | 2/2011 | Chen | G11C 5/147 365/100 |
| 7,882,365 B2 | 2/2011 | Natarajan et al. | |
| 7,889,592 B2 * | 2/2011 | Kim | G11C 16/3454 365/189.04 |
| 8,041,032 B2 | 10/2011 | Katoozi et al. | |
| 8,108,941 B2 | 1/2012 | Kanai | |
| 8,140,824 B2 | 3/2012 | Craft | |
| 8,225,182 B2 | 7/2012 | Kagan et al. | |
| 8,312,294 B2 | 11/2012 | Sato et al. | |
| 8,427,194 B2 | 4/2013 | Deas et al. | |
| 8,429,513 B2 | 4/2013 | Smith et al. | |
| 8,549,246 B2 | 10/2013 | Pekny et al. | |
| 8,576,622 B2 * | 11/2013 | Yoon | G11C 11/5642 365/185.03 |
| 8,578,179 B2 | 11/2013 | Accicmez et al. | |
| 8,745,408 B2 | 6/2014 | Mangard | |
| 8,756,439 B1 | 6/2014 | Jannson et al. | |
| 8,781,111 B2 | 7/2014 | Qi et al. | |
| 8,832,455 B1 | 9/2014 | Drewry et al. | |
| 2003/0005453 A1 | 1/2003 | Rodriguez et al. | |
| 2003/0084285 A1 | 5/2003 | Cromer et al. | |
| 2003/0084346 A1 | 5/2003 | Kozuch et al. | |
| 2003/0097579 A1 | 5/2003 | England et al. | |
| 2003/0200026 A1 | 10/2003 | Pearson | |
| 2005/0024922 A1 | 2/2005 | Li et al. | |
| 2005/0039035 A1 | 2/2005 | Clowes | |
| 2005/0058285 A1 | 3/2005 | Stein et al. | |
| 2005/0114687 A1 | 5/2005 | Zimmer et al. | |
| 2006/0026418 A1 | 2/2006 | Bade et al. | |
| 2006/0026693 A1 | 2/2006 | Bade et al. | |
| 2006/0107054 A1 | 5/2006 | Young | |
| 2006/0253708 A1 | 11/2006 | Bardouillet et al. | |
| 2008/0155273 A1 | 6/2008 | Conti | |
| 2009/0217377 A1 | 8/2009 | Arbaugh et al. | |
| 2009/0327633 A1 | 12/2009 | Fusella et al. | |
| 2010/0070779 A1 | 3/2010 | Martinez et al. | |
| 2010/0098247 A1 | 4/2010 | Suumaki | |
| 2010/0106920 A1 | 4/2010 | Anckaert et al. | |
| 2010/0146190 A1 | 6/2010 | Chang | |
| 2010/0158242 A1 | 6/2010 | Asher | |
| 2010/0169654 A1 | 7/2010 | Kiel et al. | |
| 2011/0185435 A1 | 7/2011 | Chang | |
| 2011/0283115 A1 | 11/2011 | Junod | |
| 2011/0285421 A1 | 11/2011 | Deas et al. | |
| 2012/0102307 A1 | 4/2012 | Wong | |
| 2012/0204056 A1 | 8/2012 | Airaud et al. | |
| 2012/0275595 A1 | 11/2012 | Emelko | |
| 2013/0262880 A1 | 10/2013 | Pong et al. | |
| 2013/0339730 A1 | 12/2013 | Nagai et al. | |
| 2013/0339744 A1 | 12/2013 | Nagai et al. | |
| 2014/0082721 A1 | 3/2014 | Hershman et al. | |
| 2014/0143883 A1 | 5/2014 | Shen-Orr et al. | |
| 2014/0281564 A1 | 9/2014 | Nagai et al. | |
| 2015/0074406 A1 | 3/2015 | Nagai et al. | |

FOREIGN PATENT DOCUMENTS

| | | |
|---|---|---|
| EP | 2566096 A2 | 3/2013 |
| WO | 2013035006 A1 | 3/2013 |

OTHER PUBLICATIONS

TCG PC Client Specific Implementation Specification for Conventional BIOS, Version 1.20 Final Revision 1.00, 1.2; Level 2, 119 pages, Jul. 13, 2005.
TCG PC Client Specific TPM Interface Specification (TIS), Specification Version 1.21 Revision 1.00, 103 pages, Apr. 28, 2011.
TPM Main Part 1 Design Principles, Specification Version 1.2 ,Revision 62, 150 pages, Oct. 2, 2003.
Java Security Architecture, 62 pages, Dec. 6, 1998.
Tasher et al., U.S. Appl. No. 14/244,000 filed Apr. 3, 2014.
Tasher et al., U.S. Appl. No. 14/301,456, filed Jun. 11, 2014.
Kaluzhny et al., U.S. Appl. No. 14/311,396, filed Jun. 23, 2014.
U.S. Appl. No. 14/311,396 Office Action dated Sep. 8, 2015.
U.S. Appl. No. 15/004,957 Office Action dated Feb. 24, 2016.
U.S. Appl. No. 14/301,456 Office Action dated Dec. 22, 2015.
KR Application # 10-2014-0125216 Office Action dated Feb. 16, 2016.

* cited by examiner

PROTECTION AGAINST SIDE-CHANNEL ATTACKS ON NON-VOLATILE MEMORY

CROSS-REFERENCE TO RELATED APPLICATIONS

This application claims the benefit of U.S. Provisional Patent Application 61/889,539, filed Oct. 11, 2013, whose disclosure is incorporated herein by reference.

FIELD OF THE INVENTION

The present invention relates generally to data security, and particularly to methods and systems for mitigating side-channel attacks on memory devices.

BACKGROUND OF THE INVENTION

Various techniques, such as side-channel attacks, have been developed for extracting information from electronic devices. The attacks are typically performed by unauthorized parties in order to access secret information stored within the devices. Side-channel attacks take advantage of the fact that electronic devices typically consume power during transitions of logic elements. The attacks extract information by non-invasively measuring electrical signals and/or radiation emitted from the devices, without electrically contacting the devices that carry the information.

A number of attempts have been made to develop techniques that can be implemented in electronic devices to protect secret data from unauthorized discovery by means of side-channel attacks. Some techniques of this sort are described in references cited in PCT International Publication WO 2013/035006, to Shen-Orr, et al., whose disclosure is incorporated herein by reference. The disclosure describes a method for data transfer, which comprises receiving a control signal triggering a transfer of a secret value into an element of a circuit. In response to the control signal, a dummy value and the secret value are inserted in succession into the element of the circuit.

Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

SUMMARY OF THE INVENTION

An embodiment of the present invention that is described herein provides a non-volatile memory (NVM) device including an NVM array, which is configured to store data, and control logic. The control logic is configured to receive data values for storage in the NVM array, and to write at least some of the received data values to the NVM array and simultaneously to write complements of the at least some of the received data values.

In some embodiments, the control logic includes an inverter which is configured to create the complements of the at least some of the received data values. In other embodiments, the inverter is configured to output the complements to a current sink, and in alternative embodiments, the inverter is configured to output the complements to an emulated NVM cell.

In an embodiment, the control logic is configured to write the data values for storage into a first section of the NVM array, and the control logic is configured to write the complements of the at least some of the received data values into a second section of the NVM array, different from the first section of the NVM array.

In another embodiment, the first section and the second section have equal capacities. In yet another embodiment, the control logic includes a logic gate which is configured to perform a comparison of a given data value stored in the first section of the NVM array with a complement of the given data value stored in the second section of the NVM array.

In some embodiments, the logic gate is configured to send an output signal confirming that the given data value is valid if the comparison returns positive. In alternative embodiments, the logic gate is configured to provide an alert if the comparison returns negative. In yet other embodiments, the NVM array includes a main array having a first storage capacity and configured to store the data values, and a dummy array having a second storage capacity and configured to store the complements, and wherein the second storage capacity is different from the first storage capacity.

There is additionally provided, in accordance with an embodiment of the present invention, an NVM device including an NVM array which is configured to store data, and control logic. The control logic is configured to receive data values for storage in the NVM array, and to write one only of at least some of the received data values and complements of the at least some of the received data values to the NVM array.

There is further additionally provided, in accordance with an embodiment of the present invention, a method including, in an NVM device that includes an NVM array which is configured to store data, receiving data values for storage in the NVM array, writing at least some of the received data values to the NVM array, and, simultaneously writing complements of the at least some of the received data values.

The present invention will be more fully understood from the following detailed description of the embodiments thereof, taken together with the drawings in which:

DETAILED DESCRIPTION OF EMBODIMENTS

Overview

Figure 1:
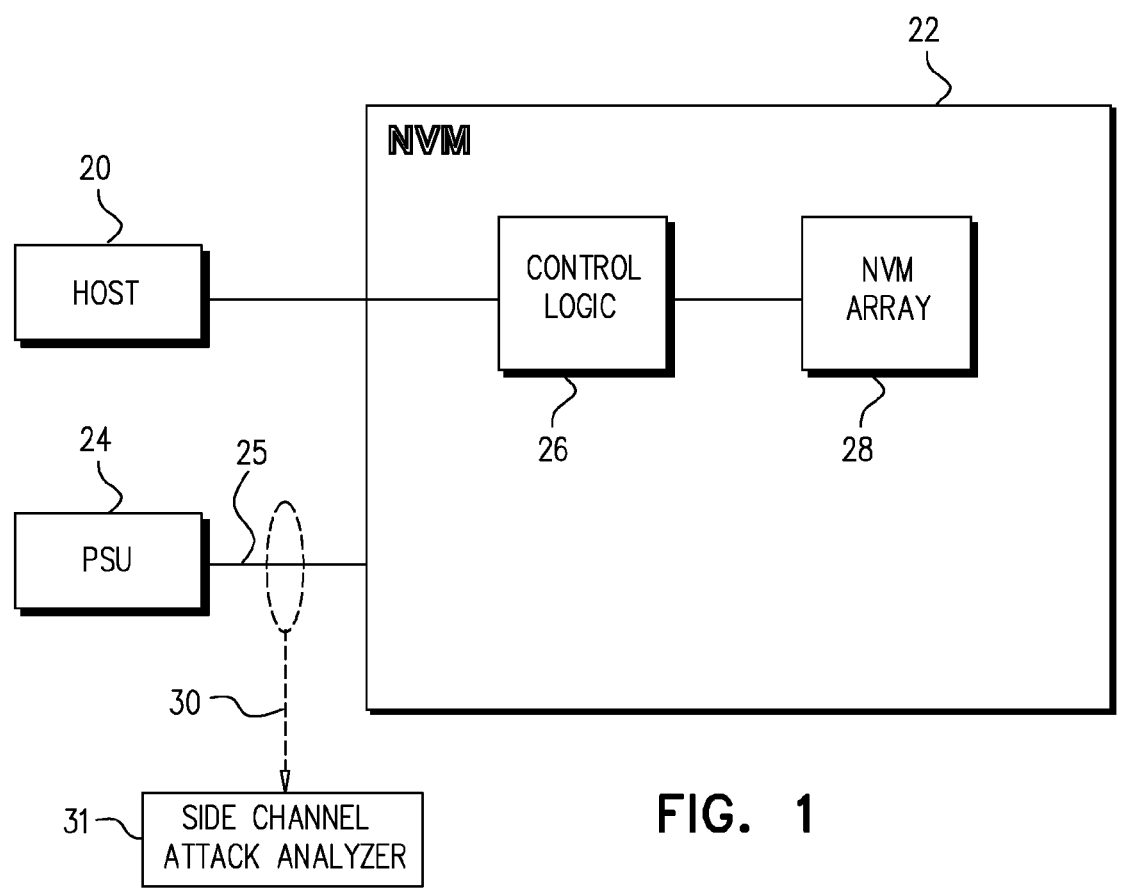
FIG. 1 is a block diagram that schematically illustrates a Non-Volatile Memory (NVM) device, which is resistant to a side-channel attack, in accordance with an embodiment of the present invention.

Electronic devices typically consume power during operation, mainly during transitions of logic elements, such as during memory programming from "0" to "1" (e.g., erase) or from "1" to "0" (e.g., write) in Non-Volatile Memory (NVM) devices. This power consumption is the source of side-channel leakage signals, which may be used by unauthorized parties to access secret information stored in the devices, by a process termed a side-channel attack.

Based on this principle, an attacker may measure power consumption or emitted radiation while a circuit element makes transitions between a known state (such as all bits=0, or a default value determined by reverse engineering) and an unknown state in which the element holds a secret value. Such attacks may be carried out by taking control of the software, performing hardware resets, or by application of power "glitches," for example. As a result of such operations, side-channel leakage signals are generally emitted from all the memory elements (e.g., bits) that make a transition, because their secret values are different from the corresponding bits holding the known value, while no (or extremely weak) signals are emitted from all the bits whose values do not change. Sensing these signals thus enables the attacker to infer the secret value by comparison with the known value.

Embodiments of the present invention that are described herein provide novel methods and circuits that can be used in reducing the vulnerability of NVM devices, such as flash memory, to side-channel attacks.

In flash devices that are known in the art, the cells (bits) are set to logical "1" when erased. Writing to a flash cell changes its value to "0". Thus, when writing a binary word to an array of flash cells, only bits that are "0" are actually written. Writing "0" thus draws current, while writing "1" (no change to the bit) draws no current. Flash write operations are therefore "leaky" with respect to side-channel analysis, since the supply current that is drawn will vary with the number of "0" bits in the number that is written. An attacker can measure this current and use it to decipher secret numbers that are written to the memory.

To foil attacks of this sort, the disclosed embodiments obfuscate the value written to the memory by leveling out the write current. In other words, these embodiments modify the functionality of an NVM device so that approximately the same current is drawn per bit regardless of whether "0" or "1" is written. Writing "0" will modify the target bit in the memory, while writing "1" may cause a complementary bit to be written to an auxiliary memory location, or to be sinked by a current path provided for this purpose. Consequently, writing the values "b'00000000" and "b'11111111," or any other binary word, will draw almost the same current.

In another embodiment, rather than writing each data value twice, including each bit and its complement, control logic in the memory device may be configured to write, for each data value that is received for storage, either the data value itself or its ones' complement. The decision as to whether to write the original or the complemented value may be made at random or according to a pseudo-random pattern. In this embodiment, 1-2 control bits are added per byte or per word to indicate whether the storage location holds the original or the complemented data value. (Two bits—"01" and "10"—can be used to foil statistical analysis that will determine whether the complemented data are signed by "1" or "0".) This embodiment may be less costly to implement but may offer weaker protection than the preceding embodiments.

System Description

FIG. 1 is a block diagram that schematically illustrates a Non-Volatile Memory (NVM) 22 device, which is resistant to a side-channel attack, in accordance with an embodiment of the present invention.

NVM 22 comprises one or more flash memories 28 also termed herein NVM array 28, which are configured to store data in their memory cells, and control logic 26, which is configured to receive data for storage from a host 20, and program this data into memory 28. In addition, control logic 26 is configured to read or erase stored data from memory 28 based on instructions from host 20. During write and erase operations memory cells change their value from "1" to "0" during writing, and from "0" to "1" after being erased.

NVM 22 receives electrical power from a Power Supply Unit (PSU) 24, on a power line 25 connecting the PSU and the NVM. Typically, memory 28 consumes power, and may therefore also emit signals 30 such as radiation, mainly during transitions of logic elements, i.e., changing their values from "0" to "1" or from "1" to "0". This power consumption is a source of side-channel signals.

The side-channel attack in FIG. 1 detects signals 30 by measuring and analyzing power and/or emitted signals from power line 25, or from one or more elements connecting to the power line, using a side-channel attack analyzer 31.

Control logic 26 typically comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Figure 2:
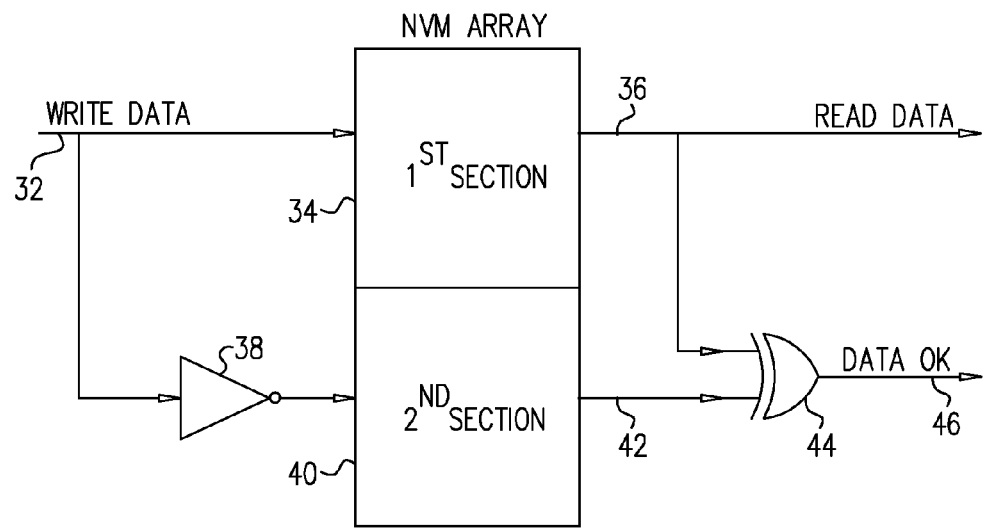
FIGS. 2-6 are block diagrams that schematically illustrate protection schemes against side-channel attacks on an NVM, in accordance with an embodiment of the present invention.

FIG. 2 is a block diagram that schematically illustrates a protection scheme against a side-channel attack on NVM 22, in accordance with an embodiment of the present invention. In an embodiment, secure control logic 26 receives a data value to be written to NVM array 28. Control logic 26 writes original data 32 to one area of the array comprising a given storage capacity, denoted $1^{st}$ section 34 and also transmits data 32 via inverter 38 to simultaneously write a set of complementary data of data 32. The complementary data is written into an auxiliary area of the array, denoted $2^{nd}$ section 40, which may comprise a similar or a different storage capacity compared to the given capacity of $1^{st}$ section 34. In this embodiment, each bit is simultaneously written twice—once in its original form, stored in $1^{st}$ section 34, and once in complementary form, stored in $2^{nd}$ section 40. As a result, the current drawn by NVM 22 is substantially invariant, regardless of the number of ones and zeros in the data value. Thus, returning to FIG. 1, the signals illustrated by arrow 30 are substantially invariant, so that any side-channel attack is foiled.

In another embodiment, complementary data 42 stored in $2^{nd}$ section 40 may be compared at readout time, using an Exclusive OR (XOR) gate 44, to data value 36 stored in $1^{st}$ section 34 in order to check the validity of the data. XOR gate 44 receives two input bits (one bit from data 36 and the other bit from data 42) and outputs a single logical value, "1" or "0". If the two input bits are identical, then XOR gate 44 returns a negative (e.g., "0") value, which means the data is not valid and issues an alert to NVM 22. Conversely, if the two input bits have different values (one bit has a "0" value and the other bit has a "1" value), then XOR gate 44 returns a positive (e.g., "1") value, and sends an output signal confirming the data is valid.

This comparison is carried out for every pair of bits, one from data 36 and the other from its complementary bit in data 42. For example, if a given bit of data 36 is set to logical "1" (erased), then its paired bit should be set to logical "0" (written) due to the operation of inverter 38. In this case, XOR gate 44, which monitors the complementary data, and outputs a "1" value in data 46, which means data is valid (labeled "data ok" in FIG. 2). In case data 36 and data 42 are set to the same value (e.g., "0"), XOR gate 44 outputs a "0" value, which means data 46 is not valid.

In yet another embodiment, the data may be read out at random from either the "$1^{st}$ section" or from the "$2^{nd}$ section" to foil other types of analysis of memory 28.

In an alternative embodiment, the write scheme of FIG. 2 may be implemented so as to foil further analysis that may identify unused areas of the NVM array. For example, although in FIG. 2 particular fixed regions of the NVM array are allocated for writing the data values and their complements, the locations used for writing the complementary data may alternatively be distributed over different parts of the array, rather than at a designated location such as $2^{nd}$ section 40, and may change during operation of NVM 22.

Figure 3:
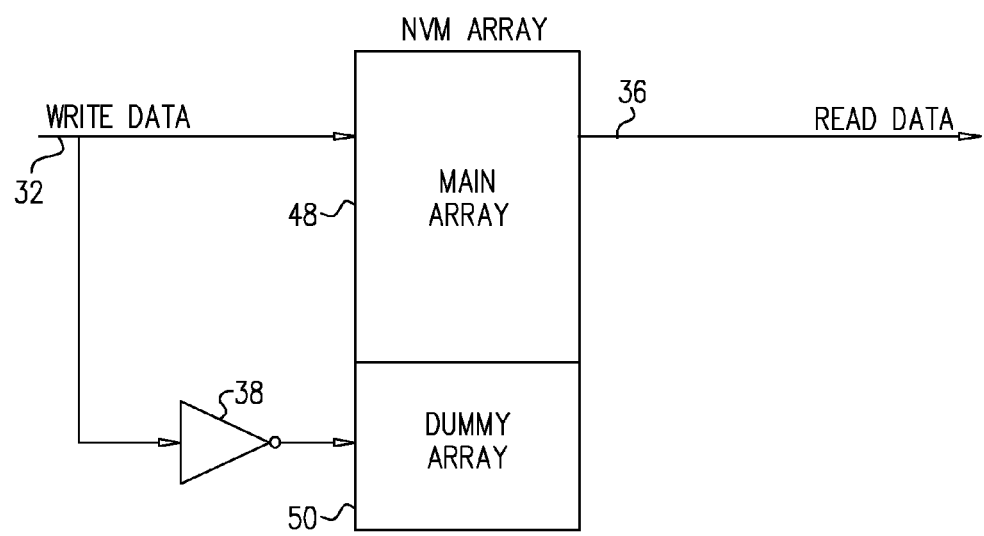

FIG. 3 is a block diagram that schematically illustrates a protection scheme against a side-channel attack on NVM 22, in accordance with an embodiment of the present invention. In the scheme of FIG. 3 NVM Array 28 is divided into a main array 48 and a dummy array 50. The scheme of FIG. 3 implements a similar scheme to that in FIG. 2, except that the complementary values of the data are written by control logic 26 to dummy array 50, rather than being actually stored and (possibly) put to use.

In an embodiment, control logic 26 writes original data 32 to main array 48, and simultaneously, data 32 pass through inverter 38, which inverts every bit of data 32 to its complementary bit, and writes the complementary data into dummy array 50. This scheme is more economical in terms of memory area that is actually needed and consumed by memory 28 compared to the embodiment illustrated by FIG. 2, while still foiling side-channel attacks.

Figure 4:
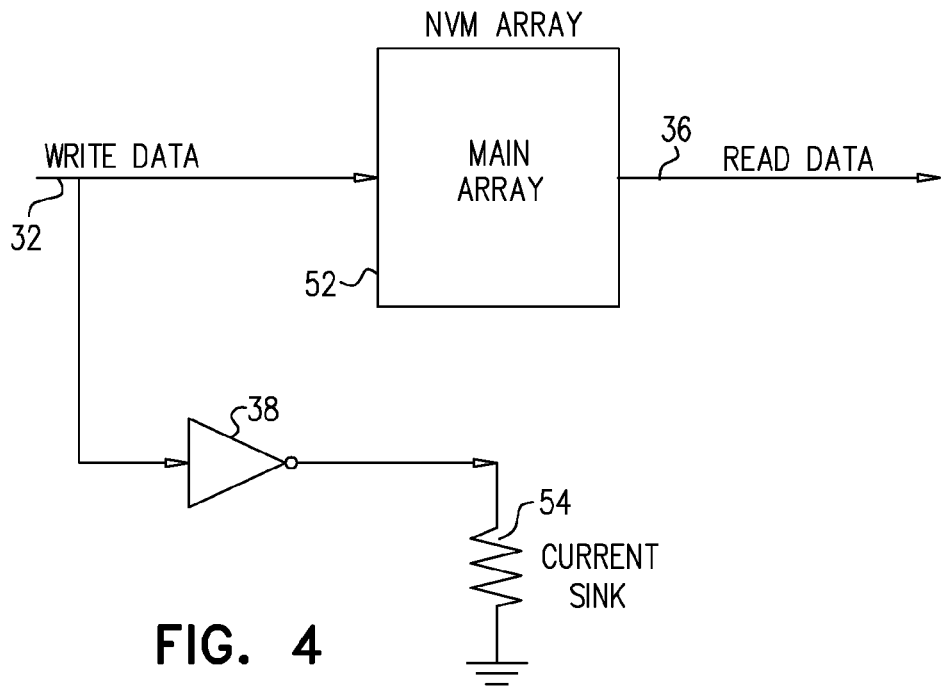

FIG. 4 is a block diagram that schematically illustrates a protection scheme against a side-channel attack on NVM 22, in accordance with an embodiment of the present invention. In an embodiment, control logic 26 obfuscates data 32 against potential side-channel attacks without using any additional memory at all relative to conventional devices. In this embodiment, each bit of original data 32 is written to a main array 52, while inverter 38 generates a set of complementary data, which drives a current sink 54, such as an electrical resistor. This technique saves memory capacity and programming management but requires a current sink device.

Figure 5:
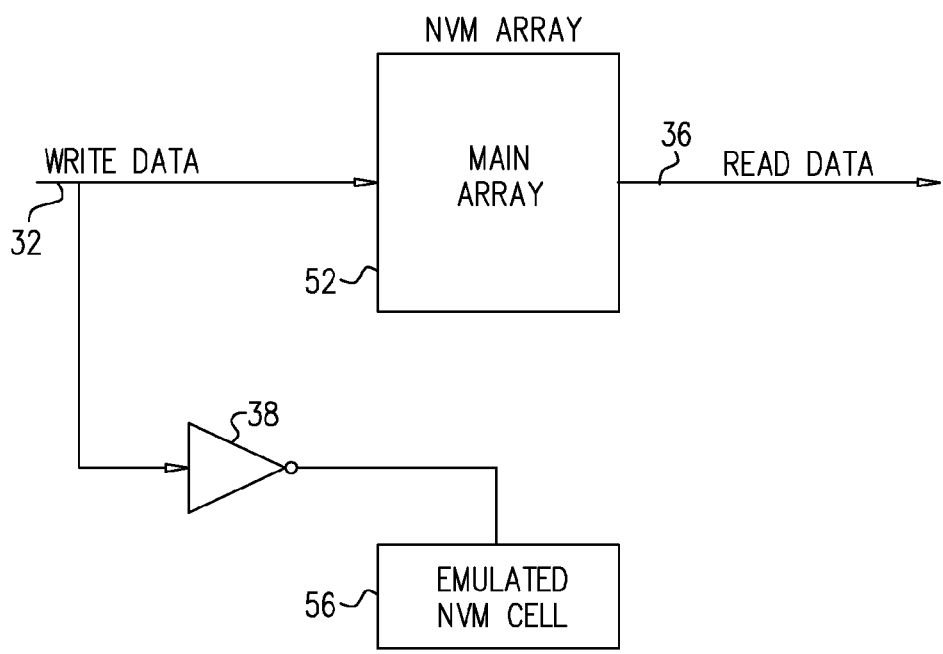

FIG. 5 is a block diagram that schematically illustrates a protection scheme against a side-channel attack on NVM 22, in accordance with an embodiment of the present invention. In some embodiments, control logic 26 writes original data 32 simultaneously to main array 52, and to inverter 38, which inverts every bit of data 32 to create the complementary data set described in FIGS. 2-4. In this embodiment, the complementary data is written into an emulated NVM cell 56, which is a circuit element that emulates the behavior and typically the current consumption, of main array 52 (such circuit elements are known in the art).

Figure 6:
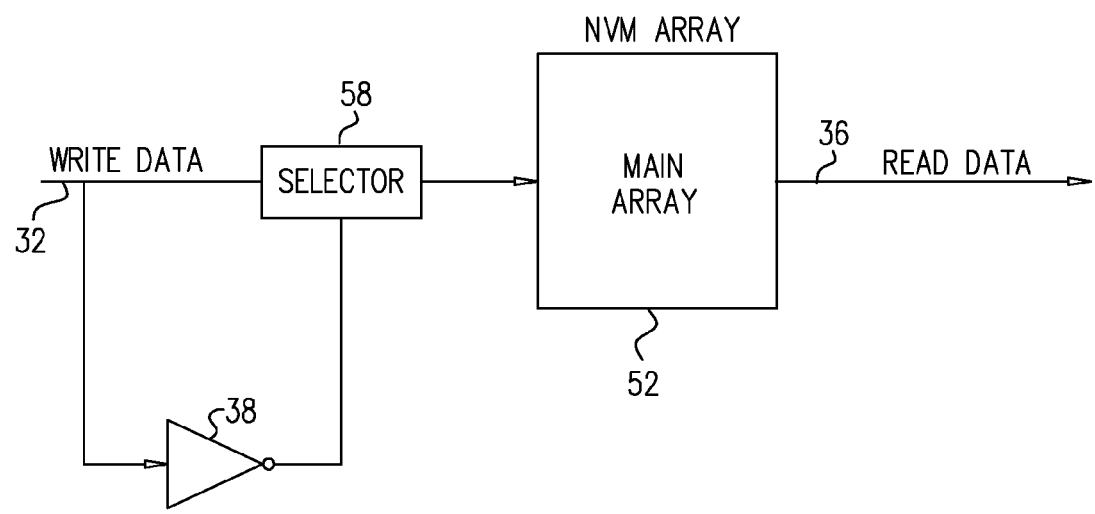

FIG. 6 is a block diagram that schematically illustrates a protection scheme against a side-channel attack on NVM 22, in accordance with an embodiment of the present invention.

In an embodiment, NVM 22 comprises a selector 58. The selector may be part of control logic 26, or a separate entity between control logic 26 and array 52. Selector 58 receives paired datasets: the original dataset, and the complementary dataset. For each pair, control logic 26 commands the selector which set of the pair (original or complementary) should be selected and sent to array 52.

For example, for a given dataset comprising six pairs of bytes, the following bytes are selected by selector 58 and sent to array 52: the first byte (e.g., 32 bits) is from the original set, the next three bytes are from the complementary set, and the fifth and sixth bytes are from the original set. In this embodiment, analyzer 31 receives signals 30 but cannot infer the secret value since part of the bytes in the given dataset are original while the others are inverted.

The decision as to whether to write the original or the complemented value may be made at random or according to a pseudo-random pattern. In this embodiment, 1-2 control bits are added per byte or per word to indicate whether the storage location holds the original or the complemented data value. (Two bits—"01" and "10"—can be used to foil statistical analysis that will determine whether the complemented data are signed by "1" or "0".) This embodiment may be less costly to implement but may offer weaker protection than the preceding embodiments.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A non-volatile memory (NVM) device, comprising:
an NVM array which is configured to store data; and
control logic, which is configured to receive data values for storage in the NVM array, and to write at least some of the received data values to the NVM array and simultaneously to write complements of the at least some of the received data values, which complements include a '0' for each '1' in the corresponding received data value and a '1' for each '0' in the corresponding received data value.

2. The device according to claim 1, wherein the control logic comprises an inverter which is configured to create the complements of the at least some of the received data values.

3. The device according to claim 2, wherein the inverter is configured to output the complements to a current sink.

4. The device according to claim 2, wherein the inverter is configured to output the complements to an emulated NVM cell.

5. The device according to claim 1, wherein the control logic is configured to write the data values for storage into a first section of the NVM array, and wherein the control logic is configured to write the complements of the at least some of the received data values into a second section of the NVM array, different from the first section of the NVM array.

6. The device according to claim 5, wherein the first section and the second section have equal capacities.

7. The device according to claim 5, wherein the control logic comprises a logic gate which is configured to perform a comparison of a given data value stored in the first section of the NVM array with a complement of the given data value stored in the second section of the NVM array.

8. The device according to claim 7, wherein the logic gate is configured to send an output signal confirming that the given data value is valid if the comparison returns positive.

9. The device according to claim 7, wherein the logic gate is configured to provide an alert if the comparison returns negative.

10. The device according to claim 1, wherein the NVM array comprises a main array having a first storage capacity and configured to store the data values, and a dummy array having a second storage capacity and configured to store the complements, and wherein the second storage capacity is different from the first storage capacity.

11. A non-volatile memory (NVM) device, comprising:
an NVM array which is configured to store data; and
control logic, which is configured to receive data values for storage in the NVM array, to determine for each received data value whether to store the value itself or its complement and to write for each received data value, either the received data value or the complement of the received data value, but not both, such that for at least some of the received data values the data values themselves are stored and for at least some of the data values the complements are stored to the NVM array.

12. A method, comprising:
- in a non-volatile memory (NVM) device, comprising an NVM array which is configured to store data, receiving data values for storage in the NVM array;
- writing at least some of the received data values to the NVM array;
- creating a bitwise complement for the at least some of the received data values; and
- writing the bitwise complements of the at least some of the received data values simultaneously with the writing of the corresponding data values to the NVM array.

13. The method according to claim 12, and comprising creating the complements of the at least some of the received data values using an inverter.

14. The method according to claim 13, wherein the inverter is configured to output the complements to a current sink.

15. The method according to claim 13, wherein the inverter is configured to output the complements to an emulated NVM cell.

16. The method according to claim 12, wherein writing the at least some of the received data values comprises writing the data values for storage into a first section of the NVM array, and writing the complements of the at least some of the received data values into a second section of the NVM array, different from the first section of the NVM array.

17. The method according to claim 16, wherein the first section and the second section have equal capacities.

18. The method according to claim 16, and comprising performing a comparison of a given data value stored in the first section of the NVM array with a complement of the given data value stored in the second section of the NVM array.

19. The method according to claim 18, wherein performing a comparison comprises sending an output signal confirming that the given data value is valid if the comparison returns positive.

20. The method according to claim 18, wherein performing a comparison comprises providing an alert if the comparison returns negative.

21. The method according to claim 12, wherein the NVM array comprises a main array having a first storage capacity and configured to store the data values, and a dummy array having a second storage capacity and configured to store the complements, and wherein the second storage capacity is different from the first storage capacity.

22. A method, comprising:
- in a non-volatile memory (NVM) device, comprising an NVM array which is configured to store data, receiving data values for storage in the NVM array;
- determining for each received data value whether to store the value itself or its complement; and
- writing one only of at least some of the received data values and complements of the at least some of the received data values to the NVM array, responsively to the determination,
- wherein for at least some of the received data values the data values themselves are stored and for at least some of the data values the complements are stored.

23. The method according to claim 22, wherein determining for each received data value whether to store the value itself or its complement comprises determining randomly.

24. The method according to claim 22, wherein writing one only of at least some of the received data values and complements comprises writing each data value with control bits which indicate whether the data value itself or the complementary was stored.

* * * * *